United States Patent [19] [11] 3,770,565
Schoolar et al. [45] Nov. 6, 1973

[54] PLASTIC MOUNTING OF EPITAXIALLY GROWN IV-VI COMPOUND SEMICONDUCTING FILMS

[75] Inventors: Richard B. Schoolar; Doris S. Lequin; Harry E. Mathews, Jr.; Ronald M. Culpepper, all of Silver Spring, Md.

[73] Assignee: The United States of America as represented by the Secretary of the Navy, Washington, D.C.

[22] Filed: Jan. 5, 1972

[21] Appl. No.: 215,981

[52] U.S. Cl. .................... 161/184, 29/588, 117/201, 148/175, 156/3, 264/272, 317/234 E

[51] Int. Cl. ..... B01j 17/00, H011 1/00, B32b 27/38

[58] Field of Search .................. 317/234 E, 235 AP; 148/1.5, 1.6, 175; 156/3; 161/182, 184; 117/201; 29/588; 264/272

[56] References Cited

UNITED STATES PATENTS

| | | | |
|---|---|---|---|
| 3,718,511 | 2/1973 | Moulin | 148/1.5 X |
| 3,739,462 | 6/1973 | Hasty | 29/588 X |
| 3,716,424 | 2/1973 | Schoolar | 117/201 |
| 3,413,713 | 12/1968 | Helda et al. | 29/588 |
| 3,139,361 | 6/1964 | Rasmanis | 148/175 |
| 3,423,516 | 1/1969 | Segerson | 29/588 X |
| 3,594,241 | 7/1971 | Bresee | 148/175 |
| 3,679,941 | 7/1972 | Lacombe et al. | 156/3 |

*Primary Examiner*—Harold Ansher
*Attorney*—R. S. Sciascia et al.

[57] ABSTRACT

Epitaxial films of the formulas $Pb_xSn_{1-x}$ B and $PbS_ySe_{1-y}$ where B is S, Te or Se, $0 \leq x \leq 1$ and $0 < y < 1$ were mounted on plastics.

12 Claims, 2 Drawing Figures

PLASTIC MOUNTING OF EPITAXIALLY GROWN IV-VI COMPOUND SEMICONDUCTING FILMS

BACKGROUND OF THE INVENTION

This invention relates generally to epitaxial films of the IV—VI compound semiconductor and their alloys and more particularly to epitaxial films of these semiconductors mounted on plastic. Lead sulfide and lead selenide polycrystalline films have been used as infrared detectors for many years. Although these detectors can be made very sensitive, their detectivities are generally limited by current noise. This has prompted some workers to investigate the use of bulk crystals as infrared detectors. Although useful devices have been demonstrated with bulk crystals they are very difficult to fabricate because they must be etched to thicknesses of only several microns.

On the other hand the use of epitaxial lead salt films as devices has been hampered by several problems. Their substrates are very fragile, and they are highly strained when cooled to lower temperatures because of differential thermal expansion between the films and their substrates.

Thus research has gone on to attempt to find films which do not have the various problems hereinbefore ennumerated.

SUMMARY OF THE INVENTION

Accordingly one object of this invention is to provide epitaxial films mounted on a substrate.

Another object of this invention is to provide epitaxial films mounted on a substrate wherein the devices prepared from said films have relatively low current noise.

A still further object of this invention is to provide epitaxial films mounted on a substrate which is not fragile.

Yet another object of this invention is to provide an epitaxial film mounted on a substrate which does not become highly strained when cooled to relatively low temperatures.

These and other objects of this invention are accomplished by providing an article comprising an epitaxial film of a material of the formulas $Pb_xSn_{1-x}$ B and $PbSySe_{1-y}$ wherein B is selected from the group consisting of S, Te and Se, $0 \leq x \leq 1$ and $0 < y < 1$ mounted on plastic.

BRIEF DESCRIPTION OF THE DRAWINGS

Still other objects and many of the attendant advantages of the present invention will be readily appreciated as the same becomes better understood by reference to the following detailed description when considered in connection with the accompanying drawings in which.

DESCRIPTION OF THE PREFERRED EMBODIMENT

The epitaxial films of the formulas $Pb_xSn_{1-x}$ B and $PbS_ySe_{1-y}$ wherein B is S, Se or Te, $0 \leq x \leq 1$ and $0 < y < 1$ are mounted on particular plastic substrates. It is preferred to have epitaxial films wherein $0 < x < 1$ so that the film is composed of three elements. With these films one can control the detectors sensitivity to different wavelengths by merely controlling the composition of the film. For example $Pb_xSn_{1-x}Te$ can be tuned to be sensitive to 11 microns at 77°K by adjusting the film composition to $Pb_{0.8}$ $Sn_{0.2}$ Te. Typically a film of the desired material is vacuum deposited on a substrate such as NaCl or KCL by art recognized techniques. Such techniques are disclosed in numerous references such as, for example application Ser. No. 24,983 by Richard B. Schoolar, filed Apr. 2, 1970 entitled Lead Sulfide PN Junction Diodes and Method of Preparation Thereof, now U.S. Pat. No. 3,716,424; Physical Reviews, Vol. 140, A330 in an article by J.N. Zemel, J.D. Jensen and R.B. Schoolar; Solid State Surface Science edited by M. Green (Dekker, New York 1969) Chpt. 5; Journal of Applied Physics, Vol. 35 No. 6, pgs. 1848–51 in an article by R.B. Schoolar and J.N. Zemel. It should be noted that these films are semiconductors and can be n-type, p-type or intrinsic.

Figure 1:
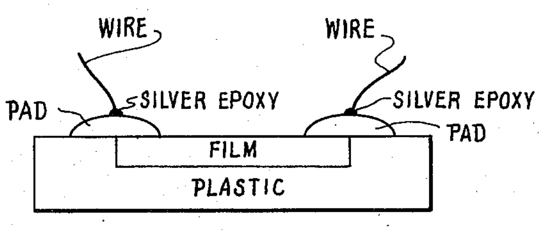
FIGS. 1 and 2 are representations of the devices which may be fabricated from the epitaxial film mounted on plastic.

Once the film has been deposited on the NaCl or KCl substrate one of two different procedures can be used to fabricate the article. The film on the substrate may be immediately mounted onto the plastic substrate and the NaCl or KCl substrate can then be dissolved with water. Following this electrical contacts can be added in order to form a device which is used as a detector. Thus two metal pads would be evaporated onto the film making sure that the two pads be made of indium, lead, platinum or gold, and most preferably platinum for making ohmic contact to p-type films and indium for making ohmic contact to n-type films, but could be any material which is an electrical conductor. Once the pads are deposited, lead wires, which are made of any electrical conductor but are preferably copper wires, are attached to the metal pads. Said attachment is preferably made by using silver epoxy but any other electrical conductor which is capable of fastening the electrical conducting pad to the electrical conducting lead wires. These lead wires are attached to the other apparatus of the detector. A device thus formed in depicted in FIG. 1.

Figure 2:
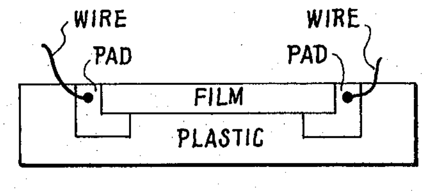

In the alternative, the film on the NaCl or KCl substrate can be fabricated into a device used in a detector by first depositing two pads of an electrical conducting material, such as platinum or indium, onto the film. Then one would attach two lead wires made of an electrical conducting material onto the two pads of electrical conducting material in the same manner as was done in the first procedure. Then the plastic substrate is molded to the film and the NaCl or KCl substrate dissolved with water. FIG. 2 depicts a device thus formed.

The plastic substrate to be used with the epitaxial films form a key part of this invention. The plastic must have good adhesion to the film as well as the other elements of the article. Additionally the substrate should have a thermal expansion coefficient which is similar to that of the film. Additionally the substrate should have relatively small shrinkage during cure. It has been found that the resistivity of the substrate should be at least about $10^5$ ohm-cm with a resistivity greater than $10^8$ ohm-cm being most preferred. Additionally the substrate should have an average thermal expansion coefficient of between about 15–35 $\times 10^{-6}$ in/in/°C over the temperature range of about 400°K to about 77°K and most preferably an average thermal expansion coefficient of 20–30$\times 10^{-6}$ in/in/°C. Epoxy resins have been found to satisfy these requirements and, in particular, epoxies with relatively large quantities of filler since the addition of filler with a relatively low expansion coefficient usually lowers the average thermal expansion coefficient. Thus, any epoxy resin which has the proper thermal expansion coefficient and resistivity may be used as the plastic substrate. A preferred epoxy resin is the diglycidyl ether of bisphenol A which additionally contains a quartz filler. It has been found that 75% by weight quartz filler (99.8% pure $SiO_2$) and 25% by weight of resin yields an excellent plastic when it is cured with the commonly used curing agents such as, for example, Tonox, an aromatic anine with a melting point below 175°F manufactured by Naugatuck Chemicals, Naugatuck, Conn.

The general nature of the invention having been set forth, the following examples are presented as specific illustrations thereof. It will be understood that the invention is not limited to these specific examples but is susceptible to various modifications that will be recognized by one of ordinary skill in the art.

EXAMPLE I

Synthetic PbSe was derived from a 100 gram ingot of PbSe which had been reacted from stoichiometric proportions of 99.999+ percent pure elements. This synthetic PbSe was vacuum-sublimed at a rate of 240 A/min onto the (100) face of an NaCl substrate maintained at 270° C. The substrate was cleaved in air just prior to placement in the evaporator. Initially, four grams of pulverized, synthetic PbSe was loaded into the quartz furnace which had been cleaned in HF, rinsed in distilled water, and baked out. Several films could be grown from this size charge. The furnace, located 8 cm from the substrate, was heated by an external coil of nichrome wire. The deposition was monitored with a Sloan thickness monitor. After the desired deposition rate was reached, the charge was outgassed for 15 minutes, and a mechanical shutter which separated the furnace and the substrate was opened. A stainless steel mask defined the shape of the film. The films were grown in a 6 inch bell jar maintained at a pressure of about $1\times10^{-5}$ Torr. After cooling to room temperature, the films were removed from the evaporator. At this point, one transfers the film to the plastic substrate and then adds the electrical contacts by attaching fine electrical conducting wires (such as copper wires) to evaporated gold pads (or pads of another electrical conducting material) with a material such as silver epoxy or any other electrical conducting material which will fasten the electrical conducting wire to the electrical conducting pads. Of course, as is known by those skilled in the art, the electrical conducting wires lead to the rest of the detector system and the pads of electrical conducting material must number at least two and must be separated. The film must of course be in contact with each of the electrical conducting pads as well as the substrate and would therefore serve as a bridge between the two electrical conducting pads.

EXAMPLE 2

The plastic mounting was made as follows: The samples were prepared by pouring a hot (about 100° C) mixture of Scotch-cast 502 epoxy resin over the film. A mold was formed by wrapping tape around the edges of the substrate. The Scotchcast 502 was cured at 70° C for 5 hours and afterwards the NaCl substrate was dissolved in water leaving the film mounted on a hard plastic. Films prepared in this manner are extremely rugged, are relatively unaffected by moisture and can be thermally cycled between 300°K and 77° K without cracking. The average thermal expansion coefficient of Scotchcast 502 is about $28\times10^{-6}$ in/in/° C and the resistivity is about $10^{15}$ ohm-cm.

Additionally, films of the compositions PbS, PbSe, PbTe, $Pb_{0.8}Sn_{0.2}Te$ and $Pb_{0.9}Sn_{0.1}Se$ have been prepared and mounted on Scotchcast 502.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. An article comprising an epitaxial film of a material selected from the group consisting of $Pb_xSn_{1-x}B$ and $PbS_ySe_{1-y}$ wherein B is selected from the group consisting of S, Se, and Te, $0 \quad x \quad 1$ and $0<y<1$, attached to a plastic mount so that at least one surface of said epitaxial film remains exposed, said mount being a cured epoxy resin which has a resistivity of at least $10^5$ ohm-cm and an average thermal expansion coefficient of $15–35\times10^{-6}$ in/in/°C over the temperature range of about 400°K to about 77°K.

2. The article of claim 1 wherein said cured epoxy resin has a resistivity of at least $10^8$ ohm-cm and an average thermal expansion coefficient of $20–30\times10^{-6}$ in/in/°C over the temperature range of about 400°K to about 77°K.

3. The article of claim 1 wherein $0<x<1$.

4. The article of claim 2 wherein $0<X<1$.

5. The article of claim 1 wherein B is Te.

6. The article of claim 3 wherein B is Te.

7. The article of claim 1 wherein B is Se.

8. The article of claim 3 wherein B is Se.

9. The article of claim 1 wherein said epoxy resin comprises the diglycidyl ether of bisphenol A.

10. The article of claim 2 wherein said epoxy resin comprises the diglycidyl ether of bisphenol A.

11. The article of claim 3 wherein said epoxy resin comprises the diglycidyl ether of bisphenol A.

12. The article of claim 4 wherein said epoxy resin comprises the diglycidyl ether of bisphenol A.

* * * * *